United States Patent
Gomez

(10) Patent No.: US 8,067,273 B2
(45) Date of Patent: Nov. 29, 2011

(54) SELF LOCKING AND ALIGNING CLIP STRUCTURE FOR SEMICONDUCTOR DIE PACKAGE

(75) Inventor: Jocel P. Gomez, Cebu (PH)

(73) Assignee: Fairchild Semiconductor Corporation, South Portland, ME (US)

(*) Notice: Subject to any disclaimer, the term of this patent is extended or adjusted under 35 U.S.C. 154(b) by 0 days.

(21) Appl. No.: 12/964,933

(22) Filed: Dec. 10, 2010

(65) Prior Publication Data

US 2011/0076807 A1    Mar. 31, 2011

Related U.S. Application Data

(62) Division of application No. 11/846,063, filed on Aug. 28, 2007, now Pat. No. 7,902,657.

(51) Int. Cl.
    *H01L 21/00* (2006.01)
(52) U.S. Cl. . 438/123; 257/692; 257/727; 257/E23.086; 257/E21.506
(58) Field of Classification Search .......... None
    See application file for complete search history.

(56) References Cited

U.S. PATENT DOCUMENTS

| | | |
|---|---|---|
| 3,956,821 A | 5/1976 | Martin |
| 4,680,613 A | 7/1987 | Daniels et al. |
| 4,720,396 A | 1/1988 | Wood |
| 4,731,701 A | 3/1988 | Kuo et al. |
| 4,751,199 A | 6/1988 | Phy |
| 4,772,935 A | 9/1988 | Lawler et al. |
| 4,791,473 A | 12/1988 | Phy |
| 4,796,080 A | 1/1989 | Phy |
| 4,839,717 A | 6/1989 | Phy et al. |
| 4,890,153 A | 12/1989 | Wu |
| 5,327,325 A | 7/1994 | Nicewarner, Jr. |
| 5,646,446 A | 7/1997 | Nicewarner, Jr. et al. |
| 5,776,797 A | 7/1998 | Nicewarner, Jr. et al. |
| 6,133,634 A | 10/2000 | Joshi |
| 6,319,755 B1 | 11/2001 | Mauri |
| 6,329,706 B1 | 12/2001 | Nam |
| 6,424,035 B1 | 7/2002 | Sapp et al. |
| 6,432,750 B2 | 8/2002 | Jeon et al. |
| 6,449,174 B1 | 9/2002 | Elbanhawy |
| 6,479,893 B2 | 11/2002 | Embong et al. |
| 6,489,678 B1 | 12/2002 | Joshi |
| 6,556,750 B2 | 4/2003 | Constantino et al. |
| 6,566,749 B1 | 5/2003 | Joshi et al. |
| 6,574,107 B2 | 6/2003 | Jeon et al. |
| 6,621,152 B2 | 9/2003 | Choi et al. |
| 6,627,991 B1 | 9/2003 | Joshi |
| 6,645,791 B2 | 11/2003 | Noquil et al. |
| 6,674,157 B2 | 1/2004 | Lang |
| 6,683,375 B2 | 1/2004 | Joshi et al. |
| 6,696,321 B2 | 2/2004 | Joshi |
| 6,720,642 B1 | 4/2004 | Joshi et al. |
| 6,731,003 B2 | 5/2004 | Joshi et al. |
| 6,740,541 B2 | 5/2004 | Rajeev |

(Continued)

*Primary Examiner* — Minh-Loan T Tran
*Assistant Examiner* — Leslie Pilar Cruz
(74) *Attorney, Agent, or Firm* — Kilpatrick Townsend & Stockton LLP

(57) ABSTRACT

A semiconductor die package. The semiconductor die package includes a semiconductor die, and a lead comprising a flat surface. It also includes a clip structure including a (i) a contact portion, where the contact portion is coupled the semiconductor die, a clip aligner structure, where the clip aligner structure is cooperatively structured with the lead with the flat surface, and an intermediate portion coupling the contact portion and the clip aligner structure.

9 Claims, 11 Drawing Sheets

U.S. PATENT DOCUMENTS

| | | |
|---|---|---|
| 6,756,689 B2 | 6/2004 | Nam et al. |
| 6,774,465 B2 | 8/2004 | Lee et al. |
| 6,777,800 B2 | 8/2004 | Madrid et al. |
| 6,806,580 B2 | 10/2004 | Joshi et al. |
| 6,830,959 B2 | 12/2004 | Estacio |
| 6,836,023 B2 | 12/2004 | Joshi et al. |
| 6,867,481 B2 | 3/2005 | Joshi et al. |
| 6,867,489 B1 | 3/2005 | Estacio |
| 6,891,256 B2 | 5/2005 | Joshi et al. |
| 6,891,257 B2 | 5/2005 | Chong et al. |
| 6,893,901 B2 | 5/2005 | Madrid |
| 6,943,434 B2 | 9/2005 | Tangpuz et al. |
| 6,989,588 B2 | 1/2006 | Quinones et al. |
| 6,992,384 B2 | 1/2006 | Joshi |
| 7,022,548 B2 | 4/2006 | Joshi et al. |
| 7,023,077 B2 | 4/2006 | Madrid |
| 7,061,077 B2 | 6/2006 | Joshi |
| 7,061,080 B2 | 6/2006 | Jeun et al. |
| 7,081,666 B2 | 7/2006 | Joshi et al. |
| 7,095,113 B2 | 8/2006 | Xiaochun et al. |
| 7,122,884 B2 | 10/2006 | Cabahug et al. |
| 7,154,168 B2 | 12/2006 | Joshi et al. |
| 7,157,799 B2 | 1/2007 | Noquil et al. |
| 7,196,313 B2 | 3/2007 | Quinones et al. |
| 7,199,461 B2 | 4/2007 | Son et al. |
| 7,208,819 B2 | 4/2007 | Jeun et al. |
| 7,215,011 B2 | 5/2007 | Joshi et al. |
| 7,217,594 B2 | 5/2007 | Manatad |
| 7,242,076 B2 | 7/2007 | Dolan |
| 7,256,479 B2 | 8/2007 | Noquil et al. |
| 7,268,414 B2 | 9/2007 | Choi et al. |
| 7,271,497 B2 | 9/2007 | Joshi et al. |
| 2001/0044167 A1* | 11/2001 | Kuo ............... 438/106 |
| 2005/0199985 A1* | 9/2005 | Xiaochun et al. ............. 257/666 |
| 2008/0036078 A1* | 2/2008 | Herbsommer et al. ....... 257/727 |

* cited by examiner

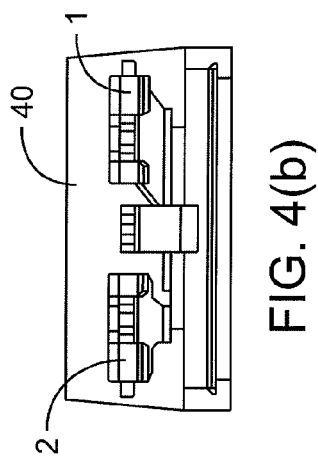
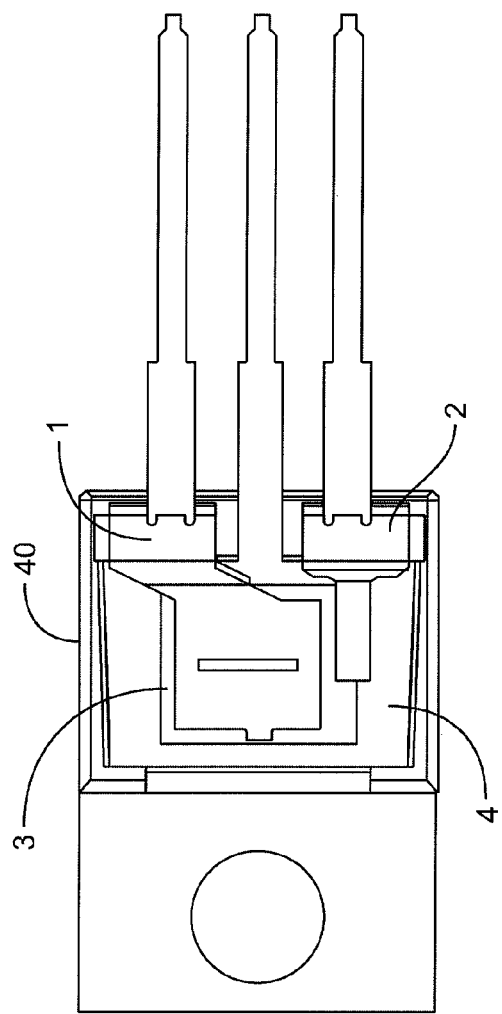
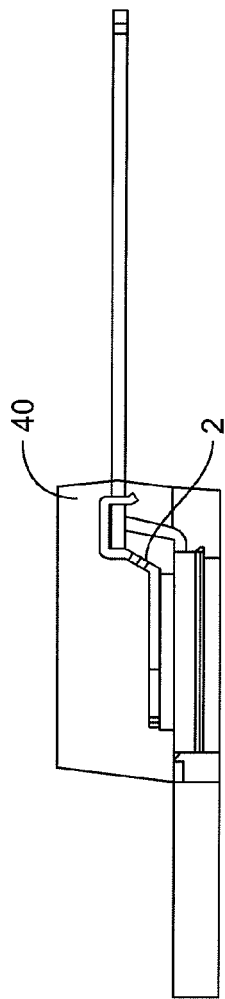
FIG. 4(b)
FIG. 4(a)
FIG. 4(c)

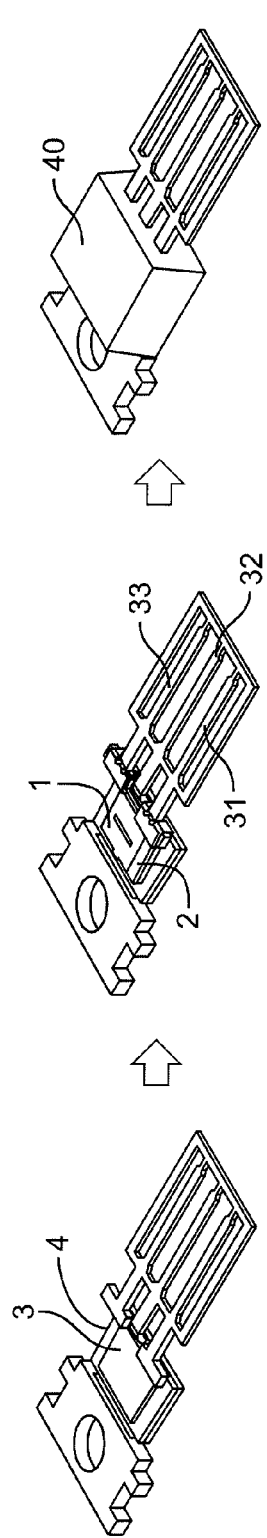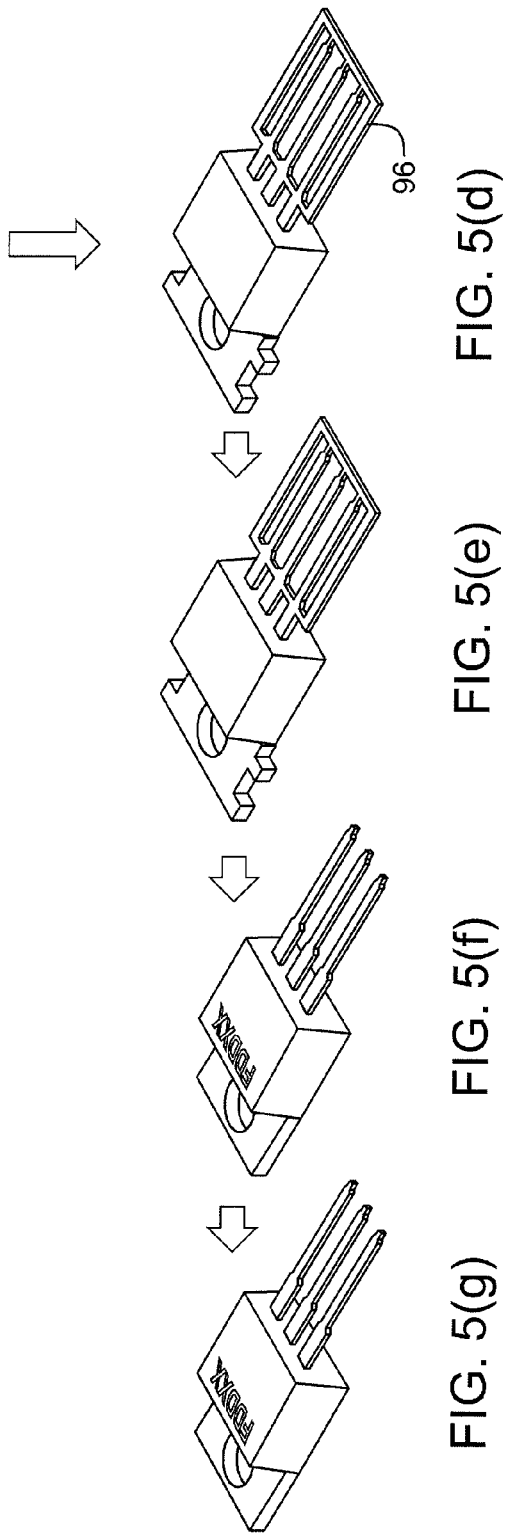

SELF LOCKING AND ALIGNING CLIP STRUCTURE FOR SEMICONDUCTOR DIE PACKAGE

CROSS-REFERENCES TO RELATED APPLICATIONS

This application is a divisional patent application of U.S. patent application Ser. No. 11/846,063, filed Aug. 28, 2007, the disclosure of which is incorporated by reference in its entirety for all purposes.

BACKGROUND

Semiconductor die packages using conductive clip structures are known. For example, a semiconductor die package using a clip structure is described in U.S. Pat. No. 6,479,893. The clip structure that is described in U.S. Pat. No. 6,479,893 connects a region at one surface of a semiconductor die to a lead. The clip structure is connected to the lead and to the semiconductor die using solder. The disclosed clip structure does not have any alignment mechanism. Consequently, when the clip structure is attached to the semiconductor die and the lead, the position of the clip structure can shift in an x, y, or z direction relative to the lead. If the clip structure is misaligned in the final semiconductor die package, rework may be necessary. This can increase the cost of the semiconductor die package.

Embodiments of the invention address this, and other problems, individually and collectively.

BRIEF SUMMARY

Embodiments of the invention are directed to semiconductor die packages, clip structures, methods for making semiconductor die packages and clip structures, as well as electrical assemblies and systems using such semiconductor die packages.

One embodiment of the invention is directed to a semiconductor die package. The semiconductor die package includes a semiconductor die, and a lead comprising a flat surface. It also includes a clip structure including a contact portion, where the contact portion is coupled to the semiconductor die, a clip aligner structure, where the clip aligner structure is cooperatively structured with the lead with the flat surface, and an intermediate portion coupling the contact portion and the clip aligner structure.

Another embodiment of the invention is directed to a clip structure for use with a lead with a flat surface, and a semiconductor die in a semiconductor die package. The clip structure comprises a contact portion, where the contact portion is capable of being electrically and mechanically coupled to the semiconductor die, a clip aligner structure, where the clip aligner structure is cooperatively structured with the lead with the flat surface, and an intermediate portion coupling the contact portion and the clip aligner structure.

Another embodiment of the invention is directed to a method for forming a semiconductor die package. The method includes obtaining a leadframe comprising a lead with a flat surface; obtaining a clip structure comprising a contact portion, a clip aligner structure, and an intermediate portion coupling the contact portion and the clip aligner structure; attaching the contact portion of the clip structure to the semiconductor die; and attaching the clip aligner structure to the lead, wherein the clip aligner structure stabilizes the position of the clip structure with respect to the lead.

These and other embodiments of the invention are described in detail in the Detailed Description with reference to the Figures. In the Figures, like numerals may reference like elements and descriptions of some elements may not be repeated.

BRIEF DESCRIPTION OF THE DRAWINGS

FIG. 4(a) shows a top view of a semiconductor die package according to an embodiment of the invention.

FIG. 4(b) shows a front view of the semiconductor die package shown in FIG. 4(a).

FIG. 4(c) shows a side view of the semiconductor die package shown in FIG. 4(a).

FIGS. 5(a)-5(g) show perspective views of portions of a semiconductor die package as the semiconductor die package is being formed.

DETAILED DESCRIPTION

One embodiment of the invention is directed to a semiconductor die package. The semiconductor die package includes a semiconductor die, and a lead comprising a flat surface. It also includes a clip structure including a contact portion, where the contact portion is coupled to the semiconductor die, and a clip aligner structure, where the clip aligner structure is cooperatively structured with the flat surface of the lead. An intermediate portion couples the contact portion and the clip aligner structure. The intermediate portion, the contact portion, and the clip aligner structure may form one integral structure.

Figure 1:
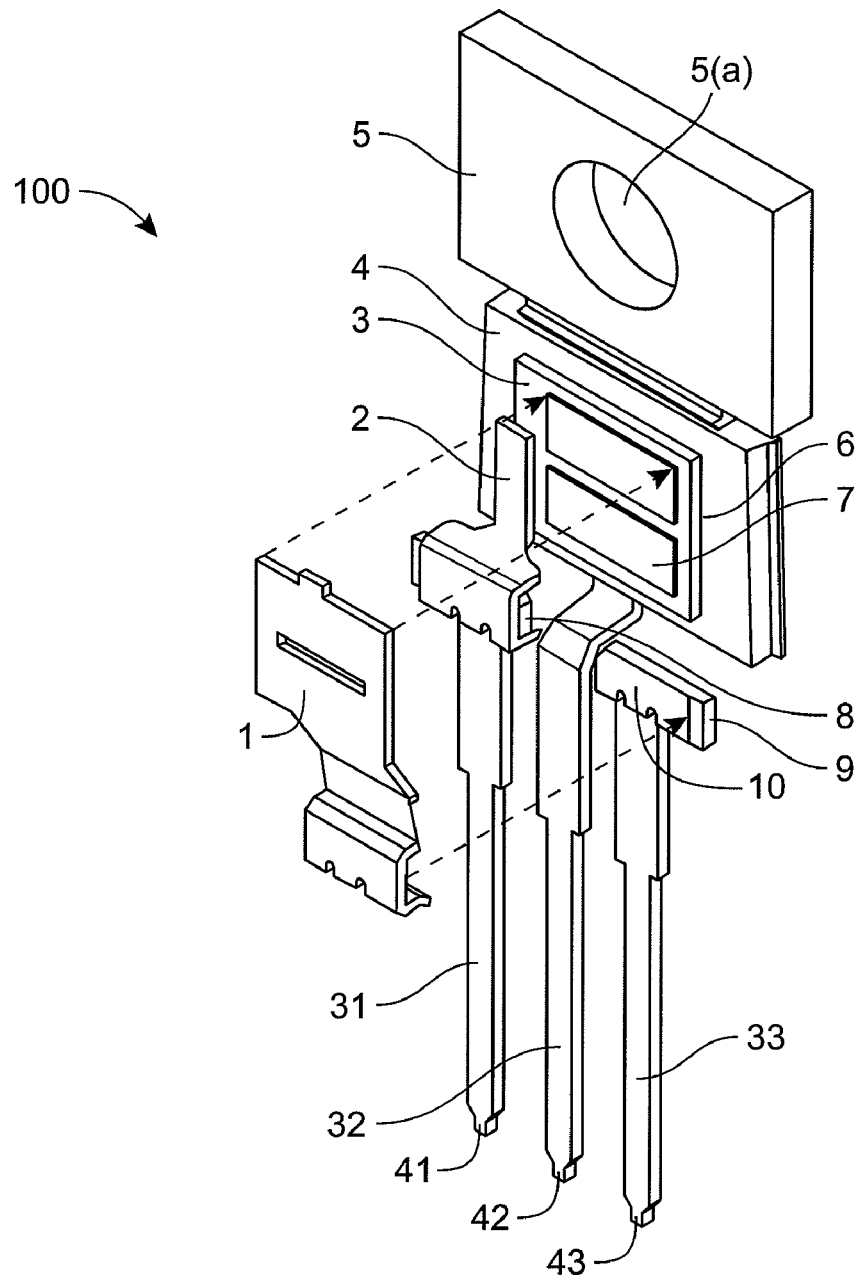
FIG. 1 shows an isometric, partially exploded, top view of a semiconductor die package according to an embodiment of the invention.

FIG. 1 shows an isometric, partially exploded top view of a semiconductor die package 100 according to an embodiment of the invention. As shown in FIG. 1, the semiconductor die package 100 comprises a heat sink 5, which has a die attach pad 4 on it. The heat sink 5 may comprise copper, aluminum, or any other suitable metal that can transfer heat from the semiconductor die 3. The die attach pad 4 may be integral to the heat sink 5, or may be a separate structure (e.g., part of a leadframe structure) that is attached to the heat sink 5. A screw hole 5(a) is formed in one portion of the heat sink 5.

The die attach pad 3 may have a drain lead 32 extending from it. The die attach pad 3 and the drain lead 32 may form at least part of a leadframe. The leadframe may comprise copper, aluminum, or any other suitable metal that can conduct electricity. Other leads in the leadframe may include a source lead 33 and a gate lead 31. The source lead 33, the gate lead 31, and the drain lead 32 may be electrically isolated from each other in the leadframe.

In this example, the leadframe, which includes the die attach pad 4, may include three lead terminals (e.g., the gate lead terminal 41, the drain lead terminal 42, and the source lead terminal 43) extending from only one side of the package 100. In other embodiments, there can be more than three lead terminals in a single semiconductor die package, and those lead terminals may extend from one, two, three, or even four sides of the semiconductor die package.

The semiconductor die package 100 also includes a semiconductor die 3. In some cases, the semiconductor die 3 may have an output region (e.g., a drain region) proximate to the die attach pad 4, while an input region (e.g., a source region) may be proximate to the clip structure 1 (or vice-versa). The semiconductor die 3 can be attached to the die attach pad 4 using a conductive adhesive 6 such as solder or a conductive epoxy (e.g., solder, a silver-filled epoxy, etc.). In addition, the semiconductor die 3 may comprise any suitable semiconductor material including silicon.

Figure 18:
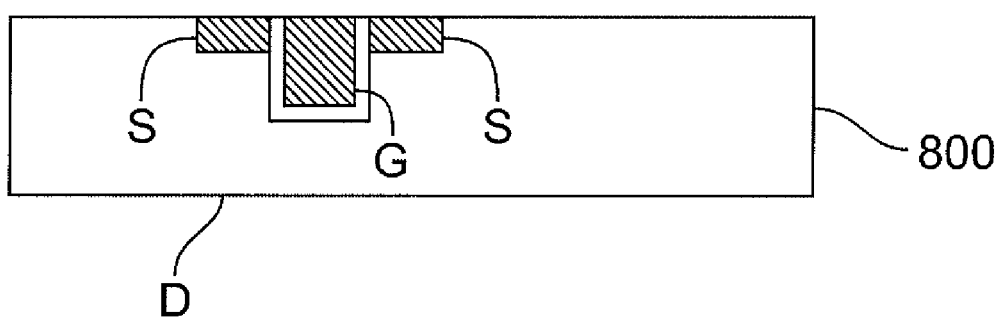
FIG. 18 shows a schematic illustration of a semiconductor die comprising a vertical MOSFET with a trenched gate.

The semiconductor dies used in the semiconductor packages according to preferred embodiments of the invention include vertical power transistors. Vertical power transistors include VDMOS transistors. A VDMOS transistor is a MOSFET that has two or more semiconductor regions formed by diffusion. It has a source region, a drain region, and a gate. The device is vertical in that the source region and the drain region are at opposite surfaces of the semiconductor die. The gate may be a trenched gate structure or a planar gate structure, and is formed at the same surface as the source region. Trenched gate structures are preferred, since trenched gate structures are narrower and occupy less space than planar gate structures. During operation, the current flow from the source region to the drain region in a VDMOS device is substantially perpendicular to the die surfaces. An example of a semiconductor die 800 comprising a vertical MOSFET with a trenched gate is shown in FIG. 18. Other devices that may be present in a semiconductor die may include diodes, BJT (bipolar junction transistors) and other types of electrical devices.

Referring to FIG. 1, a first source clip structure 1 may be coupled to the upper surface of the semiconductor die 3 using a conductive adhesive 7 and may also be coupled to a source lead post 9 in the source lead 33 using another conductive adhesive 10. The conductive adhesives 6, 7, 10, may be the same or different, and may be in any suitable form. As shown in FIG. 1, the source lead post 9 may have a larger area than the source lead terminal 43 that extends outward from it, and may be oriented somewhat perpendicular to the source lead terminal 43. The first source clip structure 1 may provide an external connection to a source region in the semiconductor die 3.

A second gate clip structure 2 may also be coupled to the upper surface of the semiconductor die 3 using another conductive adhesive (not shown) and may also coupled to the gate lead post 8 of the gate lead 31. The gate lead post 8 may have a larger area than the gate lead terminal 41 that extends outward from it, and may be oriented somewhat perpendicular to the gate lead terminal 41. The second gate clip structure 2 may provide for a gate connection to the gate region in the semiconductor die 3.

The clip structures 1, 2, may comprise copper, aluminum, or any other suitable metal that can conduct electricity. They may also be plated with other metals. They may also be formed in any suitable manner (e.g., etching, stamping, etc.).

A molding material (not shown) such as an epoxy molding material may cover at least a portion of the semiconductor die 3, the die attach pad 4, and the first and second clip structures 1, 2. The molding material may provide protection for the semiconductor die 3. In some embodiments, the molding material does not cover the bottom surface of the heat sink 5 so that the heat sink 5 can transfer heat from the semiconductor die 3 to the external environment.

Figure 2A:
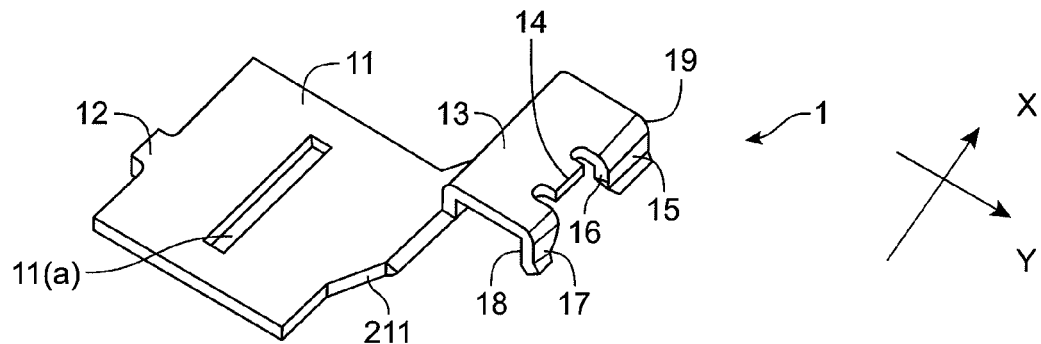
FIGS. 2(a)-2(b) show perspective views of a clip structure according to an embodiment of the invention.
Figure 2B:
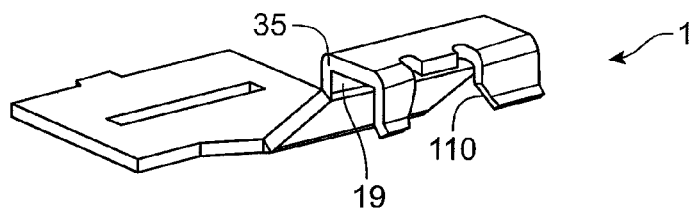

FIGS. 2(a)-2(b) show perspective views of the first source clip structure 1. The second gate clip structure 2 may have features that are similar to or different than the first source clip structure 1. In general, the second clip structure 2 may be smaller in size than the first source clip structure 1.

As shown in FIGS. 2(a) and 2(b), the first source clip structure 1 comprises a flat contact portion 11 and a tie bar 12 extending from the contact portion 11. A longitudinal slot 11(a) passes through the contact portion 11, and can be used as a mold locking feature. The tie bar 12 connects the first source clip structure 1 to other source clip structures (not shown) during processing. The first source clip structure 1 also comprises an aligner structure 19, which is coupled and downset with respect to the contact portion 11 via an intermediate portion 211. The aligner structure 19, the contact portion 11, and the intermediate portion 211 may be an integral structure that may be formed using any suitable process including stamping, etching, etc.

The aligner structure 19 has a flat portion 13, and a tie bar 14 and a wall 35 extending from the flat portion 13. Parallel (e.g., right and left) vertical aligners 15, 17 also extend perpendicular to the flat portion 13 in the same direction as the wall 35, and may define a recess through which the previously described source lead 33 will reside in the package 100. As shown in FIG. 2(a), the vertical aligners 15, 17 may have chamfered edges 110 for easy insertion onto the source lead 33 (see FIG. 3). A first clip lock surface 16 on aligner structure 15, which is perpendicular to the top surface of the flat portion 13, can serve as a horizontal aligner, thereby preventing the movement of the clip structure 1 relative to the source lead 33 (see FIGS. 1 and 3) in the X direction. A second clip lock surface 18 may be on the inner surface of the vertical aligner 17, and may restrict movement of the clip structure 1 relative to the previously described source lead 33 in the Y direction. The flat portion 13 restricts movement of the clip structure 1, relative to the previously described source lead 33 in the Z direction.

Figure 3:
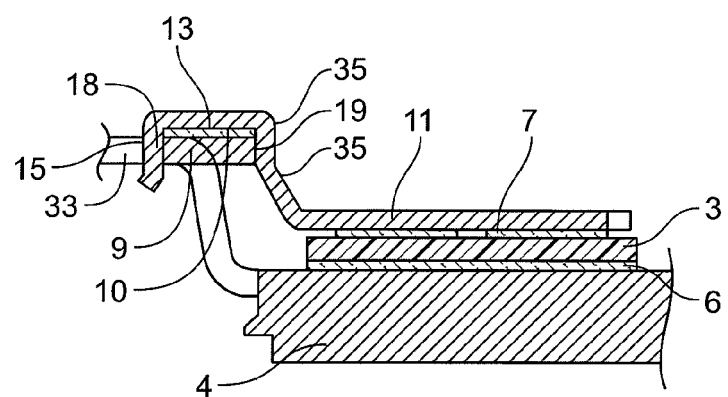
FIG. 3 is a side view of a portion of a semiconductor die package according to an embodiment of the invention.

FIG. 3 shows a side view of the first source clip structure 1 as it is attached to the source lead 33 and the semiconductor die 3. As shown in FIG. 3, the aligner structure 19 may comprise the wall 35, a flat portion 13, and a vertically oriented aligner structure 15, 17, and these elements may form a U-shape. The U-shape is cooperatively structured with the flat upper surface of the source lead 33. In FIG. 3, the inner faces of the U-shaped aligner structure 19 are substantially in contact with the surfaces of the source lead 33. In other embodiments, the aligner structure 19 could be cooperatively structure in some other way to restrict the movement of the clip structure 1 relative to the source lead 33. For example, the inner surfaces of the aligner structure 19 may not be in substantial face to face contact with the surfaces of the lead 33 to restrict the movement of the clip structure 1.

The conductive adhesive 10 provides a secure bond between the high surface area provided by the flat portion 13 of the aligner structure 19 and the flat surface of the lead 33. FIG. 3 also shows a contact portion 11 of the clip structure 1 being secured to the semiconductor die 3 using the conductive adhesive 7. As shown in FIG. 3, the movement of the clip structure 1 relative to the source lead 33 is restricted, and the clip structure 1 cannot move in the X direction, the Y direction, and downward in the Z direction. This results in a more reliable package as the chance of misalignment between the lead 33 and the clip structure 1 is minimized.

FIGS. 4(a)-4(c) respectively show top, side, and front views of the semiconductor die package 100. As noted above, like numerals designate like elements and the descriptions are not repeated. In addition, FIGS. 4(a)-4(c) show a molding material 40 which may cover at least part of the semiconductor die 3, as well as the clip structures 1, 2, and the die attach pad 4. For clarity of illustration, the components inside of the molding material 40 are shown in FIGS. 4(a)-4(c).

Some embodiments are directed to methods of making semiconductor die packages. In one embodiment, the method comprises obtaining a leadframe structure, obtaining a semiconductor die, obtaining a lead comprising a flat surface, and obtaining a clip structure comprising (i) a contact portion, (ii) a clip aligner structure, wherein the clip aligner structure is cooperatively structured with the lead with the flat surface, and (iii) an intermediate portion coupling the contact portion and the clip aligner structure. These components may be obtained in any suitable manner. For example, they can be manufactured or purchased. After they are obtained, the contact portion of the clip structure is attached to the semiconductor die. Before or after this is done, the clip aligner structure is attached to the lead. Additional process details are provided below. In addition, although one clip structure and one die are mentioned for simplicity of illustration, there may be multiple semiconductor dies, clip structures, etc. within a single die package in other embodiments of the invention.

FIGS. 5(a)-5(g) show portions of a semiconductor die package according to an embodiment of the invention as it is being formed. Although one semiconductor die package is shown in FIGS. 5(a)-5(g), the semiconductor die package may be formed in an array and in parallel with a number of other semiconductor die packages.

As shown in FIG. 5(a), a conductive adhesive is deposited on the previously described die attach pad 4 of a leadframe, and a semiconductor die 3 is attached to the die attach pad 4. The conductive adhesive may be deposited on the pad 4 and cured using any suitable processes. Suitable types of conductive adhesives are mentioned above.

As shown in FIG. 5(b), the first and second clip structures 1, 2 are attached to the semiconductor die 3 and the source and gate leads 33, 31, respectively. A suitable conductive adhesive (e.g., solder or a conductive epoxy) may be coated on the clip structures 1, 2, leads 33, 31, and/or the semiconductor die 3 before attachment.

As shown in FIG. 5(c), a molding material 40 is then formed around at least part of the semiconductor die 3, the first and second clip structures 1, 2, and portions of the source and gate leads 33, 31, as well as the die attach pad 4. The molding material may be molded using conventional molding processes. Suitable molding temperature and pressures may be determined by those of ordinary skill in the art.

As shown in FIG. 5(d), a deflash process can be performed. In a deflash process, excess molding material may be removed from areas where it is not desired. At some subsequent time, the frame 96 may be removed, thus leaving the previously described leads 31, 32, 33 electrically isolated from each other.

As shown in FIG. 5(e), the leads can then be plated if desired. The leads may be plated using any suitable plating process including electroplating, electroless plating, etc. The leads may further be plated with various materials including solder-compatible materials.

As shown in FIGS. 5(f)-5(g), marking and singulation processes can be performed, and then subsequent test, tape, and reel process can be performed. Marking may be performed using any suitable marking process (e.g., laser or ink marking).

Figure 6:
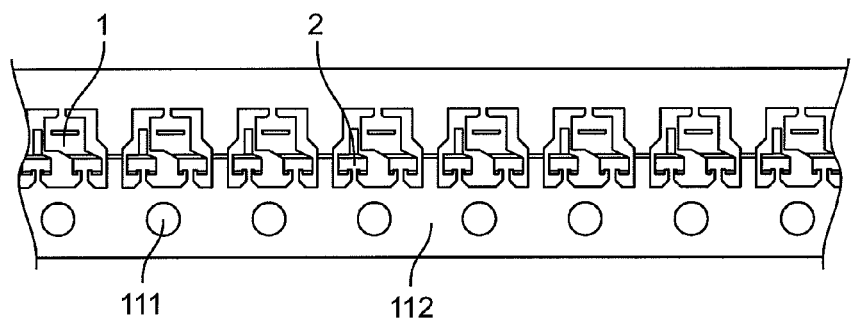
FIG. 6 shows gate and source clip structures on a reeled frame.
Figure 7:
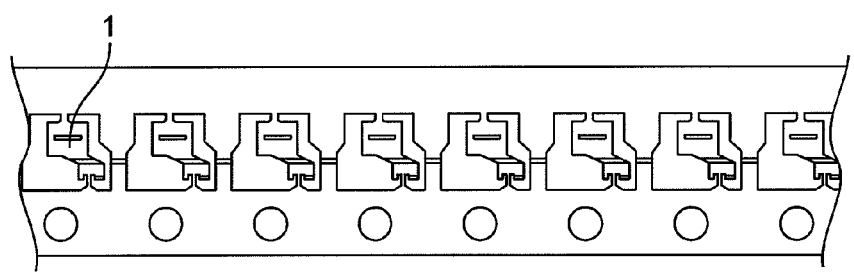
FIG. 7 shows all source clip structures on a reeled frame.

FIG. 6 shows an array of clip structures 1, 2. The clip structures 1, 2, are held together with a clip structure frame 112, and the clip structure frame 112 has index holes 111. As shown in FIG. 7, all source clip structures 1 are on a reeled frame. The clip structure arrays in FIGS. 6-7 may be used to manufacture an array of semiconductor die packages.

Figure 8A:
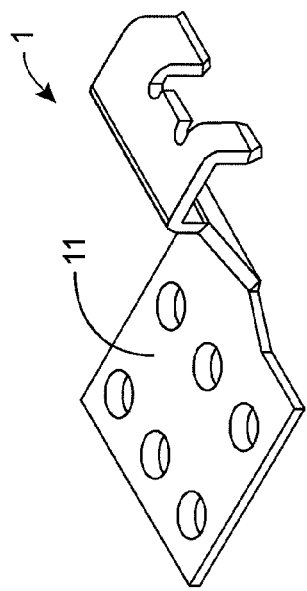
FIGS. 8(a)-8(d) shows perspective views of various clip structure embodiments.
Figure 8B:
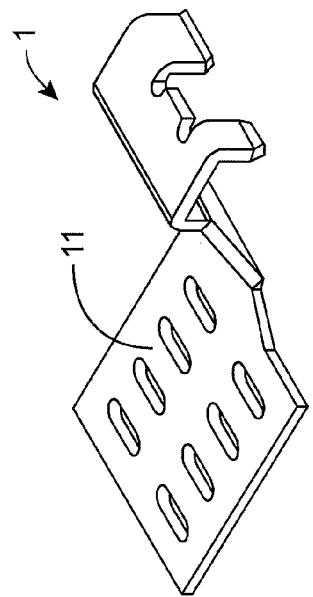
Figure 8C:
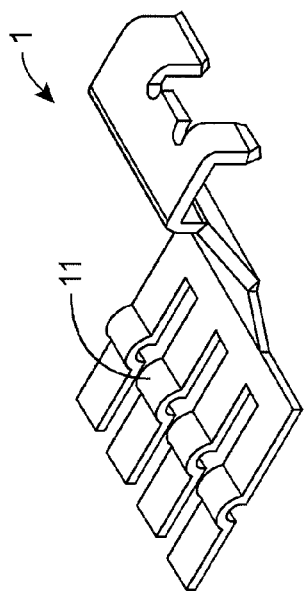
Figure 8D:
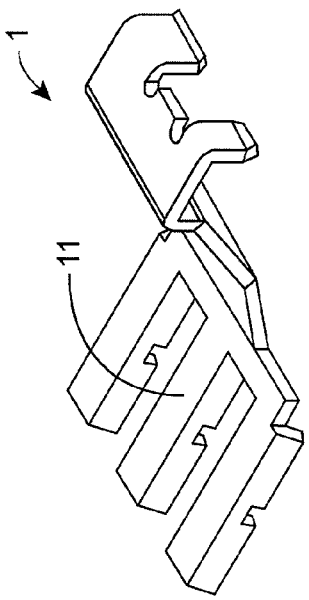

FIGS. 8(a)-8(d) show various different clip structure configurations. FIG. 8(a) shows a design including a contact portion 11 in the form of fork prongs. Each prong includes a bump (a semicircular bump). FIG. 8(b) shows dimples in the contact portion 11. FIG. 8(c) shows folded portions in the contact portion 11. FIG. 8(d) shows slots in the contact portion 11. Each of these structures can help lock the clip structures to a molding material.

Figure 9B:
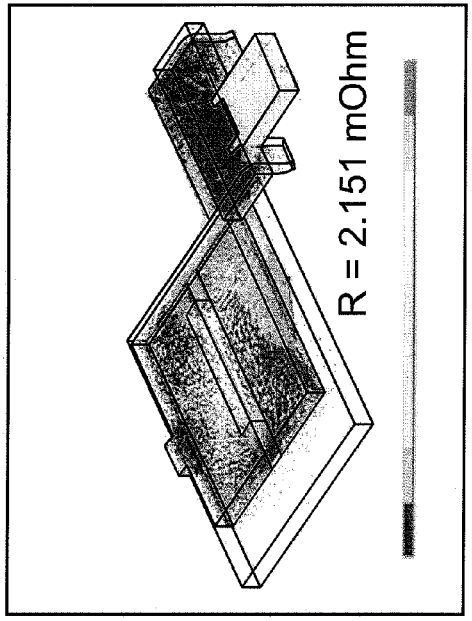
FIG. 9(b) shows FEA analysis data for clip structures used in embodiments of the invention.
Figure 9A:
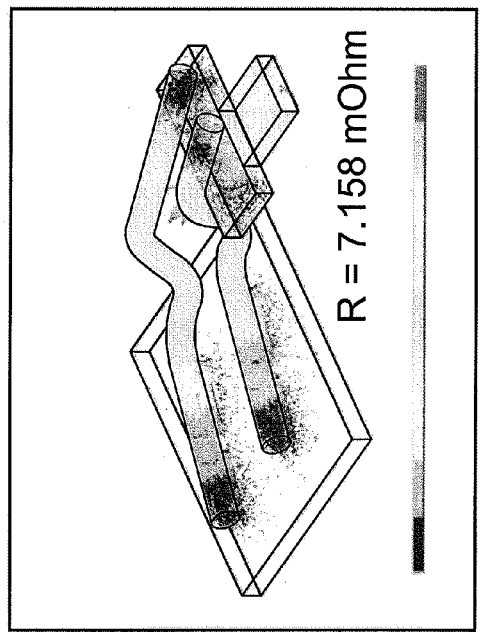
FIG. 9(a) shows FEA analysis data for wirebonds.

FIGS. 9(a) and 9(b) respectively show electrical resistance FEA simulation results for wirebonded packages and packages using the clip structures according to embodiments of the invention. As shown, with the use of a copper clip structure connected a die source and a source lead post, the $R_{DS}$ (drain to source resistance) is reduced compared to aluminum wire bonding. The results indicate up to a 70 percent improvement in $R_{DS}$ can be obtained when using the clip structures according to embodiments of the invention as compared to aluminum wire bonds.

Figure 10:
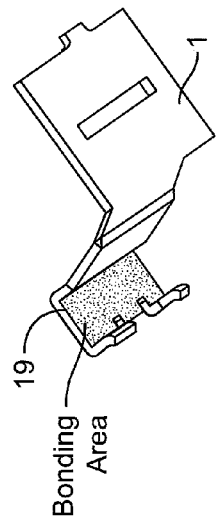
FIG. 10 shows a bottom, perspective view of a clip structure according to an embodiment of the invention.

FIG. 10 shows the bottom bonding area of the alignment structure in a clip structure. As shown, the large bonding area improves bonding strength between the lead and the clip structure. It also provides for a larger conduction path, thereby reducing resistance.

Figures 11A, 11B:
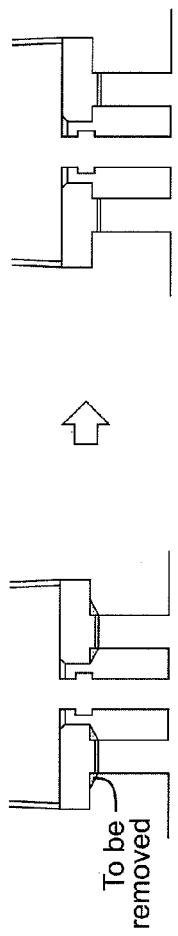
FIGS. 11(a) and 11(b) show how lead post areas can be modified for a self aligning and locking clip structure applications.
Figure 12:
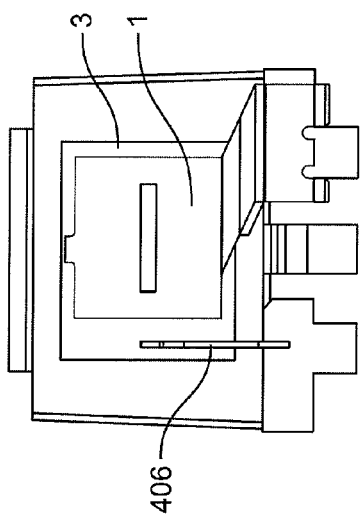
FIG. 12 shows a package using a clip structure and a wirebond.

FIGS. 11(a)-11(b) show configurations that provide for bonding configuration flexibility. The clip structure is designed in such a way that only minimal change is needed on a existing TO220 leadframes as shown in FIGS. 11(a) and 11(b). FIG. 12 shows how a clip structure 1 can be used with a wirebond 406 in a semiconductor die package according to an embodiment of the invention.

Figure 13A:
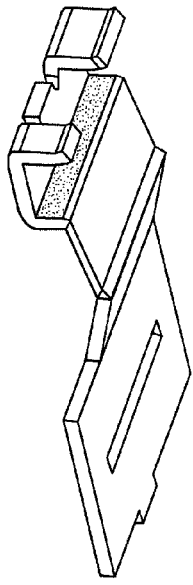
FIGS. 13(a) and 13(b) show perspective views of clip structures with shaded clip structure areas that can help stabilize the clip structure in a Y position.
Figure 14A:
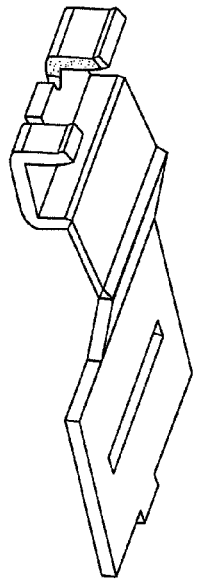
FIGS. 14(a) and 14(b) show perspective views of clip structures with shaded clip structure areas that can help stabilize the clip structure in an X position.
Figure 13B:
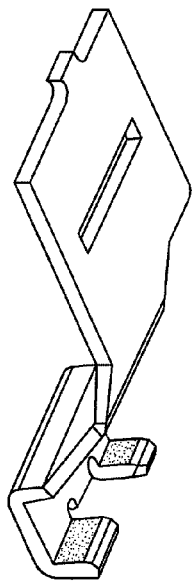
Figure 14B:
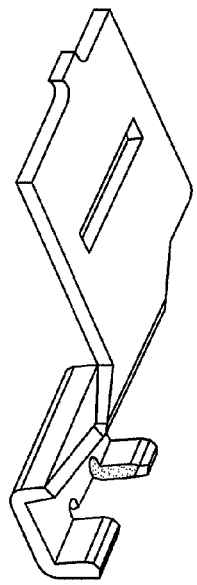
Figure 15:
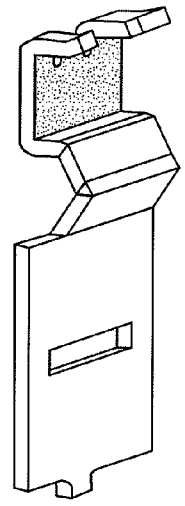
FIG. 15 shows a perspective view of a clip structure with a shaded clip structure area, which provides better Z positioning of the clip structure and better bonding strength.

Embodiments of the invention are robust and stable. By employing the alignment structure which is formed by bending for lead post clamping, stable x-y-z positioning is achieved during the formation of a semiconductor die package. As shown in FIG. 13, the shaded areas of the clip structure lead posts maintain a stable Y position. As shown in FIG. 14, the shaded areas of the clip structure leads maintain a stable X position. As shown in FIG. 15, the large shaded bonding area provides for better bonding area and better Z positioning.

Figure 16:
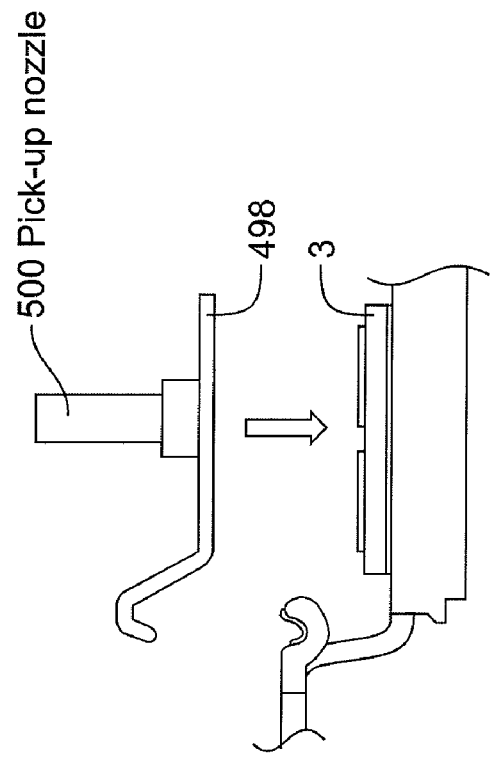
FIG. 16 shows how a pick up nozzle picks up a clip structure according to an embodiment of the invention.

A permanent and large pick-up area on a clip structure 1 as shown in FIG. 16. As shown in FIG. 16, a pick-up nozzle contacts the alignment structure to self lock/align the finger clip structure design.

Figure 17:
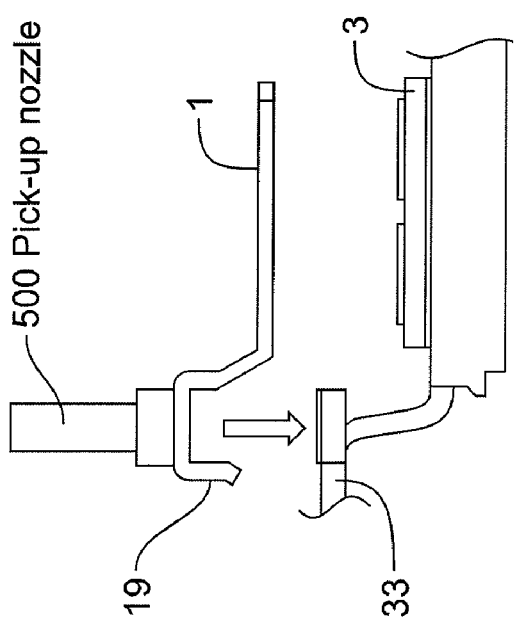
FIG. 17 shows how a pick up nozzle picks up a conventional clip structure.

FIG. 17 shows a pick up nozzle 500 contacting a conventional clip structure 498. As shown, the nozzle 500 contacts the contact portion of the conventional clip structure 498, and can apply pressure to the die 3. In contrast, FIG. 16 shows how a nozzle 500 can contact the flat upper surface of the aligner structure 19 of the clip structure 1 according to an embodiment of the invention. Pressure need not be applied to the semiconductor die 3, thus reducing the chance of damaging the semiconductor die 3.

Embodiments of the invention provide for a number of advantages. First, the aligner structure stabilizes the position of the clip structure relative to the lead to which it is attached. This provides for more reliable and consistent positioning and reduces the need for rework. Second, the aligner structure has a large contact area so that a secure bond can form between the aligner structure and its corresponding lead. Third, embodiments of the invention have reduced resistance as compared to conventional wirebonded packages Fourth, the aligner structure can be used as a contact point for a pick up nozzle. The contact area need not be used as the contact point, and pressure need not be applied to the semiconductor die, thereby reducing the chance for potential rework.

As used herein "top" and "bottom" surfaces are used in the context of relativity with respect to a circuit board upon which the semiconductor die packages according to embodiments of the invention are mounted. Such positional terms may or may not refer to absolute positions of such packages.

The semiconductor die packages described above can be used in electrical assemblies including circuit boards with the packages mounted thereon. They may also be used in systems such as phones, computers, etc.

Any recitation of "a", "an", and "the" is intended to mean one or more unless specifically indicated to the contrary.

The terms and expressions which have been employed herein are used as terms of description and not of limitation, and there is no intention in the use of such terms and expressions of excluding equivalents of the features shown and described, it being recognized that various modifications are possible within the scope of the invention claimed.

Moreover, one or more features of one or more embodiments of the invention may be combined with one or more features of other embodiments of the invention without departing from the scope of the invention.

What is claimed is:

1. A method comprising:
   stamping a metal sheet to form a clip structure comprising
   a contact portion, wherein the contact portion is capable of being electrically and mechanically coupled to a semiconductor die,
   a clip aligner structure comprising a planar center section and substantially vertical ends forming a U shape, wherein the clip aligner structure is cooperatively structured with a lead with a flat surface, and wherein the clip aligner structure is configured to encompass the flat surface of the lead, and
   an intermediate portion coupling the contact portion and the clip aligner structure.

2. A method for forming a semiconductor die package, the method comprising:
   obtaining a leadframe comprising a lead with a flat surface;
   obtaining a clip structure comprising a contact portion, a clip aligner structure, and an intermediate portion coupling the contact portion and the clip aligner structure, wherein the clip aligner structure comprises a planar center section and substantially vertical ends forming a U-shape;
   attaching the contact portion of the clip structure to a semiconductor die; and
   attaching the clip aligner structure to the lead such that the clip aligner structure encompasses the flat surface of the lead, wherein the clip aligner structure stabilizes the position of the clip structure with respect to the lead.

3. The method of claim 2 wherein the clip structure comprises copper.

4. The method of claim 2 wherein the clip structure is a first clip structure, the contact portion is a first contact portion, and the aligner structure is a first aligner structure, and the lead is a first lead, and wherein the method further comprises attaching a second clip structure with a second aligner structure to the semiconductor die and a second lead.

5. The method of claim 2 further comprising molding a molding material around at least a portion of the semiconductor die, and the clip structure.

6. The method of claim 2 further comprising attaching the semiconductor die to a die attach pad.

7. The method of claim 2 wherein the semiconductor die comprises a power MOSFET.

8. The method of claim 2 wherein the intermediate portion comprises a flat portion substantially non-parallel to the contact portion.

9. The method of claim 2 wherein the clip aligner structure's planar center section is substantially non-parallel to the clip aligner structure's contact portion.

* * * * *